(12) United States Patent
Frank

(10) Patent No.: US 6,899,569 B2
(45) Date of Patent: May 31, 2005

(54) LAYERED INTERFACE DEVICE

(75) Inventor: Chien Frank, Taipei (TW)

(73) Assignee: Wing-Span Enterprise Co., Ltd., Hsi-Chih (TW)

( * ) Notice: Subject to any disclaimer, the term of this patent is extended or adjusted under 35 U.S.C. 154(b) by 0 days.

(21) Appl. No.: 10/672,988

(22) Filed: Sep. 25, 2003

(65) Prior Publication Data

US 2004/0080905 A1 Apr. 29, 2004

(51) Int. Cl.⁷ .......................................... H01R 13/502
(52) U.S. Cl. ................................ 439/701; 439/717
(58) Field of Search ............................. 439/717, 701, 439/540.1, 710, 541.5; 361/683, 730, 790, 390, 689, 686, 729, 732; 174/15.1

(56) References Cited

U.S. PATENT DOCUMENTS 5,122,077 A * 6/1992 Maejima et al. ............ 439/398
6,714,417 B2 * 3/2004 Yu ............................... 361/730
6,731,514 B2 * 5/2004 Evans .......................... 361/790

* cited by examiner

Primary Examiner—Alex Gilman

(57) ABSTRACT

A layered interface device comprises an interface box and a supporter. The interface box is connected to a computer or other similar system. The supporter is connected to the interface box. The supporter includes at least one arm. The arm has two connecting portions. The first connecting portion serves to be connected to the interface box. The second connecting portion is connected to a respective supporter of another interface box. Thereby, a plurality of interface devices are assembled by using respective supporters so that the interface boxes connected to the respective supporters are overlapped with one another.

1 Claim, 4 Drawing Sheets

LAYERED INTERFACE DEVICE

FIELD OF THE INVENTION

The present invention relates to interface devices, and particularly to a layered interface device, wherein a plurality of interface boxes can be stacked one by one by supporters of the interface boxes.

BACKGROUND OF THE INVENTION

In current computer devices, a plurality of peripherals are equipped to a computer, and thus a plurality of interfaces, such as USB or 1394 interface, are needed. These interfaces are connected to the computer through signal converters for data input and output. In general these interfaces are packaged in interface boxes The specification of the interface boxes are not unified so that different interfaces are placed in different interface boxes. These interface boxes are placed on table disorderedly and thus they occupy a large space. As a result, the space cannot be used effectively and an unbeautiful outlook is presented.

SUMMARY OF THE INVENTION

Accordingly, the primary object of the present invention is to provide a layered interface device which comprises an interface box and a supporter. The interface box is connected to a computer or other similar system. The supporter is connected to the interface box and then is connected to other interface box. The first supporter includes at least one arm. The arm has two connecting portions. The first connecting portion serves to be connected to the interface box. The second connecting portion is connected to a respective supporter of another interface box. Thereby, a plurality of interface devices are assembled by using respective supporters so that the interface boxes connected to the respective supporters are overlapped with one another.

The various objects and advantages of the present invention will be more readily understood from the following detailed description when read in conjunction with the appended drawing.

DETAILED DESCRIPTION OF THE PREFERRED EMBODIMENTS

Figure 1:
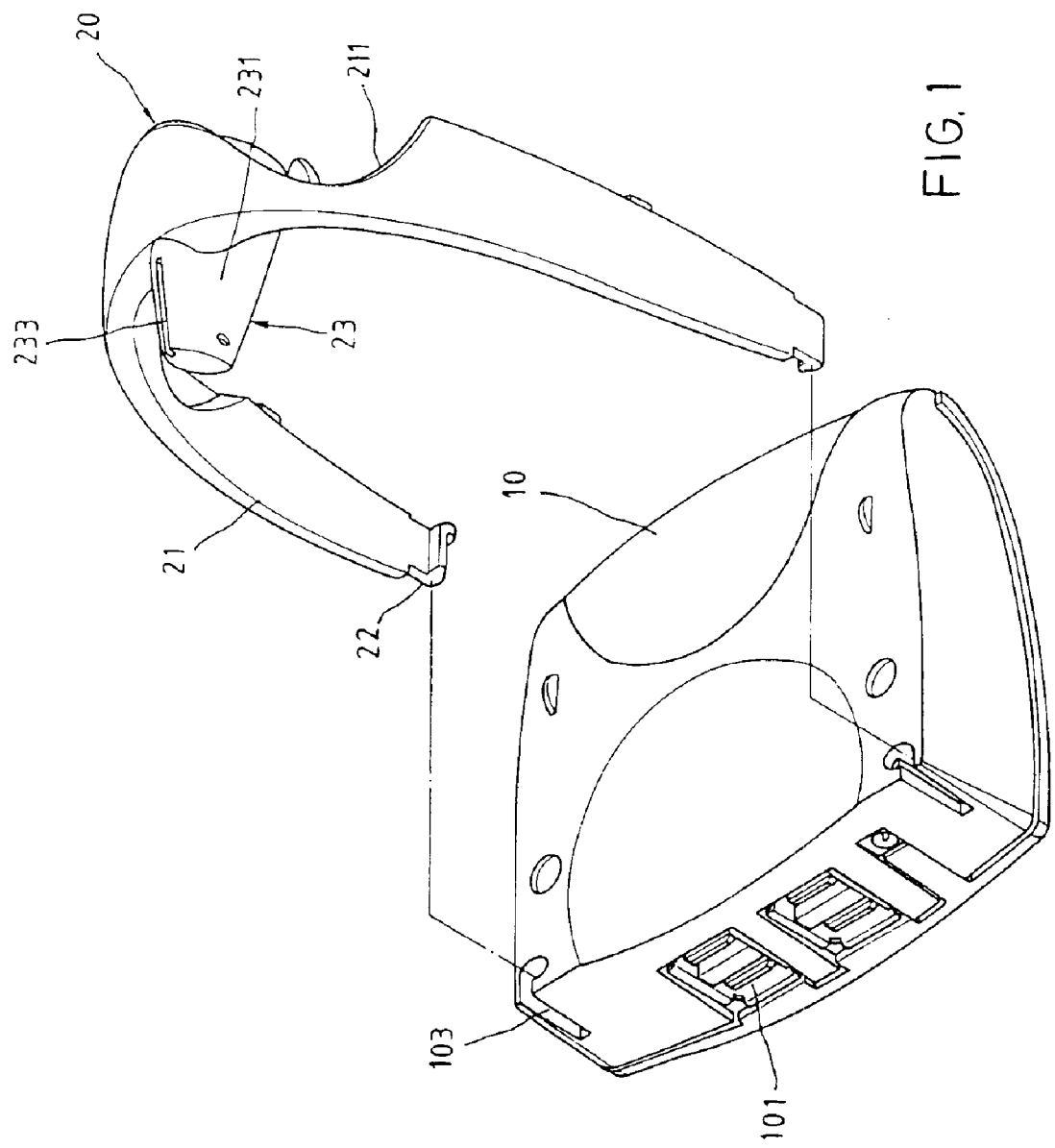
FIG. 1 shows a plurality of the main components of the interface device of the present invention.
Figure 2:
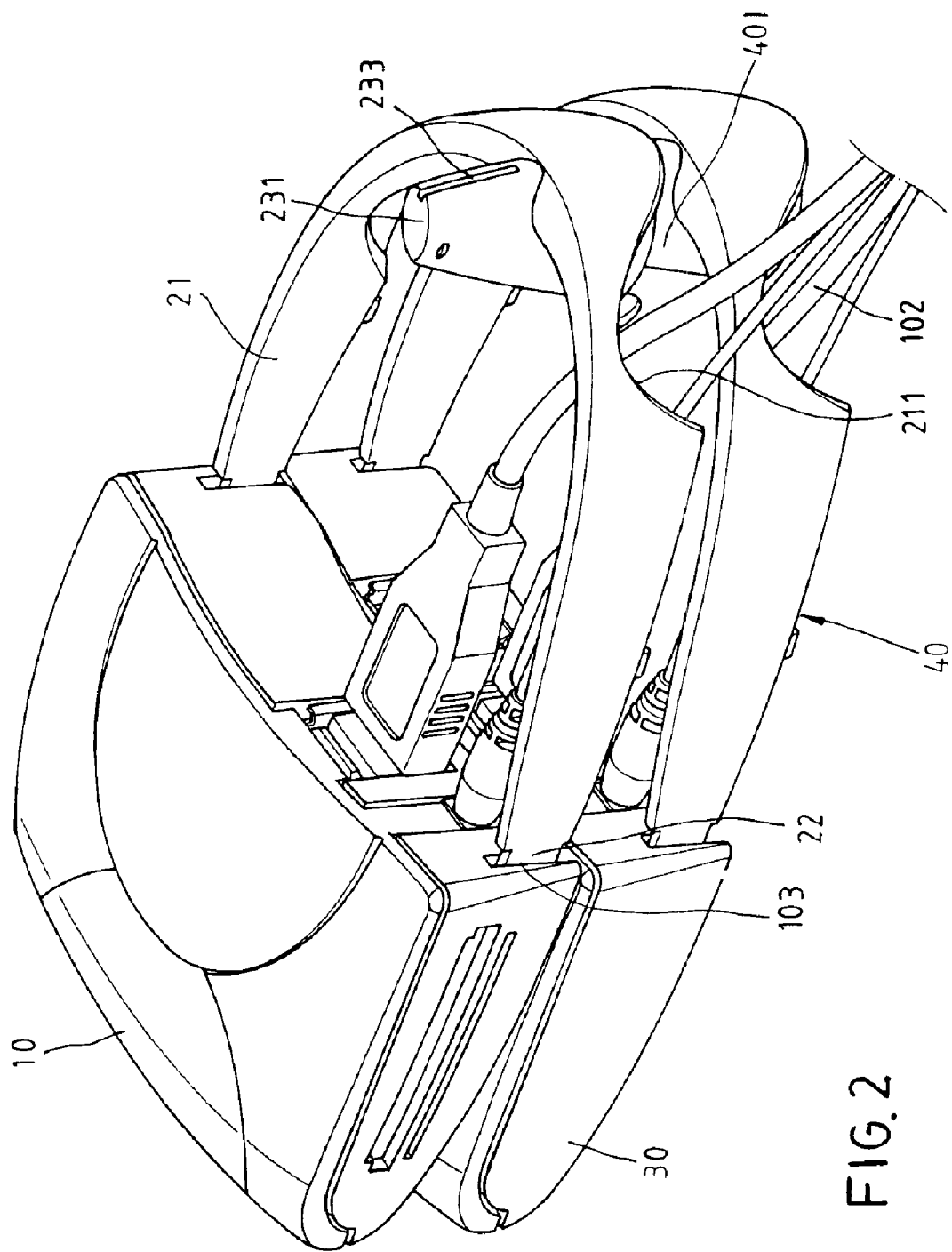
FIG. 2 is a perspective view of the stacked interface devices of the present invention.

Referring to FIGS. 1 and 2, the interface device of the present invention includes a first interface box 10 and a first supporter 20. The first interface box 10 is connected to a computer or other similar system. The interface box 10 can include a USB interface, or a 1394 interface, etc. The first supporter 20 can be connected to the first interface box 10 and is overlapped to the first interface box 10. The first supporter 20 includes at least one arm 21. The arm 21 has two connecting portions 22 and 23. The first connecting portion 22 serves to be connected to the first interface box 10. The second connecting portion 23 is connected to a respective supporter 30 (referring to FIG. 2). Thereby, a plurality of interface devices are assembled to the respective supporters so that the interface box connected to the respective supporter can be overlapped and connected.

Figure 3:
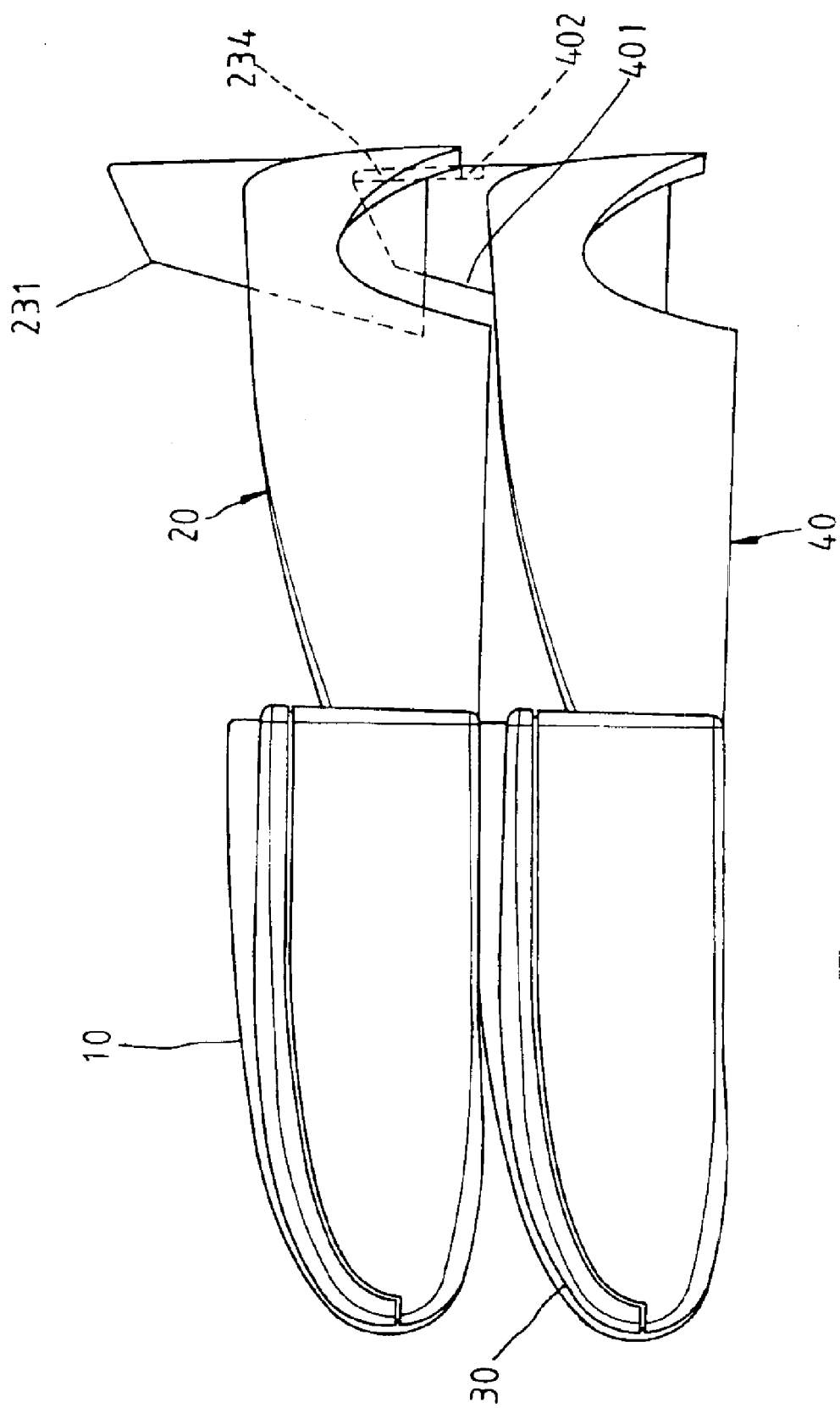
FIG. 3 is a schematic view showing the stacking operation of the present invention.
Figure 4:
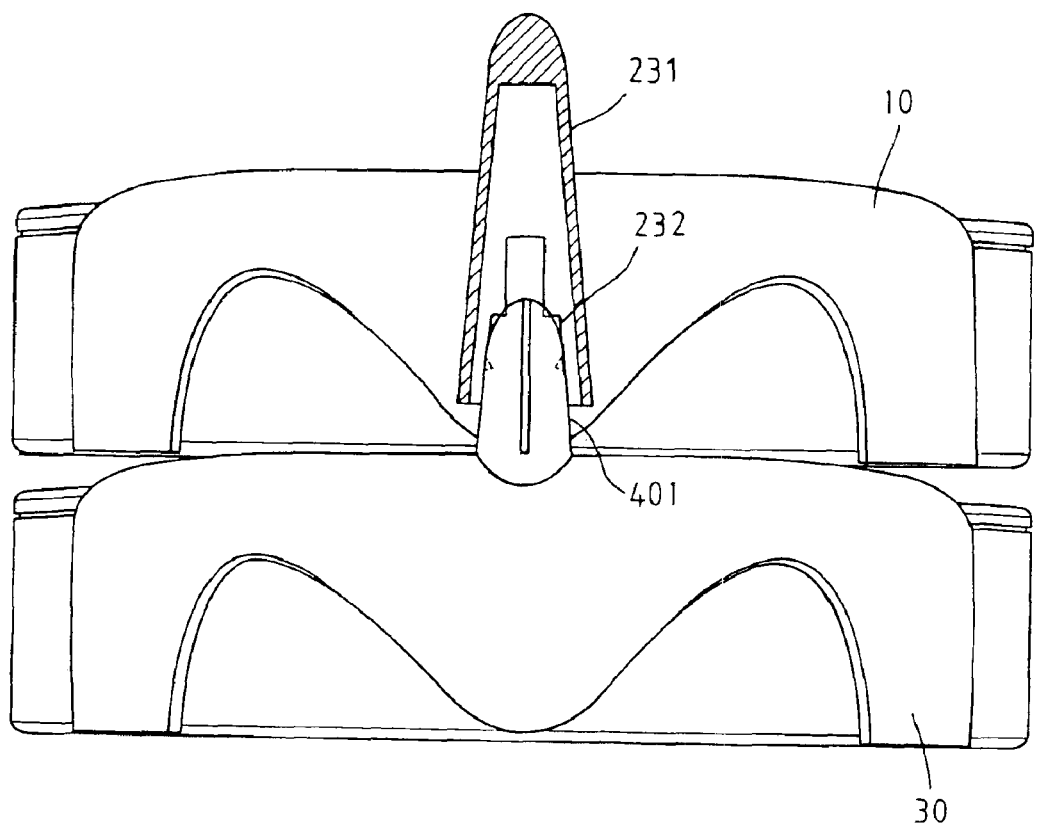
FIG. 4 is another schematic view showing the stacking operation of the present invention.

In the present invention, a predetermined position of the first interface box 10 is installed with a slot 103 for being inserted by the first connecting portion 22 of the first supporter 20. The second connecting portion 23 of the supporter 20 has a protrusion 231. An interior of the protrusion 231 has a receiving chamber 232 for being inserted by another protrusion 401 of the supporter 40 of another first interface box, as shown in FIGS. 3 and 4. An outer surface of the protrusion 231 is installed with a guide groove 233. The receiving chamber 232 of the protrusion 231 has a track 234 at a position with respect to the guide groove 233. By the track 234 of the first supporter to slide into the guide groove 402 of another supporter so that the first supporter 20 is connected to another supporter 30.

Moreover, in the present invention, the arm 21 of the supporter 20 has at least one notch 211. Thereby, connecting wires 102 connecting the interface box 10 can pass through the notch to be connected to the external computer or other similar system (referring to FIG. 2).

The present invention is thus described, it will be obvious that the same may be varied in many ways. Such variations are regarded as a departure from the spirit and scope of the present invention, and all such modifications as would be obvious to one skilled in the art are intended to be included within the scope of the following claims.

What is claimed is:

1. A layered interface device comprising an interface box and a supporter; the interface box being connected to a computer or other similar system; the supporter being connected to the interface box; characterized in that:

the supporter includes at least one arm; the arm has a first and a second connecting portion; the first connecting portion is connected to the interface box; the second connecting portion is connected to a supporter of another interface box; thereby, a plurality of interface devices are assembled by using respective supporters so that the interface boxes connected to the respective supporters are overlapped with one another;

wherein the second connecting portion of the supporter has a protrusion; an interior of the protrusion has a receiving chamber; another protrusion of another supporter is inserted into the receiving chamber of the protrusion so as to connect two interface boxes;

wherein an outer surface of the protrusion is installed with a guide groove; the receiving chamber of the protrusion has a track at a position with respect to the guide groove; by the track of the first supporter to slide into the guide groove of another supporter, the supporter of the interface box is connected to another supporter.

* * * * *